US008656858B2

(12) United States Patent
Schneider

(10) Patent No.: US 8,656,858 B2
(45) Date of Patent: Feb. 25, 2014

(54) DEVICE AND METHOD FOR CHEMICALLY AND ELECTROLYTICALLY TREATING WORK PIECES USING A CONVEYOR SYSTEM TO TRANSPORT WORK PIECES BETWEEN TREATMENT TANKS

(75) Inventor: Reinhard Schneider, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 1634 days.

(21) Appl. No.: 11/570,791

(22) PCT Filed: Jun. 30, 2005

(86) PCT No.: PCT/EP2005/007196

§ 371 (c)(1),
(2), (4) Date: Jul. 6, 2007

(87) PCT Pub. No.: WO2006/002969

PCT Pub. Date: Jan. 12, 2006

(65) Prior Publication Data

US 2007/0256923 A1    Nov. 8, 2007

(30) Foreign Application Priority Data

Jul. 1, 2004    (DE) .......................... 10 2004 032 659

(51) Int. Cl.
| | | |
|---|---|---|
| *B05C 3/132* | (2006.01) | |
| *B05C 3/02* | (2006.01) | |
| *H01L 21/68* | (2006.01) | |
| *B05C 13/00* | (2006.01) | |
| *B05D 1/18* | (2006.01) | |

(52) U.S. Cl.
USPC ............... 118/423; 118/61; 118/64; 118/412; 118/503; 427/430.1; 205/128; 205/163; 205/166; 438/782; 454/187; 204/297.06; 414/217; 414/222.02; 414/749.6

(58) Field of Classification Search
USPC ............................ 118/500; 414/217; 204/192
See application file for complete search history.

(56) References Cited

U.S. PATENT DOCUMENTS

| | | | | |
|---|---|---|---|---|
| 1,427,877 | A | * | 9/1922 | Weeks ........................... 205/671 |
| 3,756,435 | A | * | 9/1973 | Steigerwald .................. 414/217 |
| 3,968,020 | A | * | 7/1976 | Nagano et al. ................ 204/203 |
| 4,184,927 | A | * | 1/1980 | Takahashi et al. ............ 205/107 |
| 4,363,712 | A | | 12/1982 | Birkle et al. |

(Continued)

FOREIGN PATENT DOCUMENTS

| | | | | |
|---|---|---|---|---|
| DE | 8328191 | | 11/1983 | |
| DE | 3929728 | A1 * | 3/1991 | ............... H05K 3/02 |

(Continued)

*Primary Examiner* — Dah-Wei Yuan
*Assistant Examiner* — Karl Kurple
(74) *Attorney, Agent, or Firm* — Paul & Paul

(57) ABSTRACT

A device and a method for chemically or electrolytically treating work pieces (1) are proposed in an effort to avoid irregular contours of finest conductive structures, pads and lands as well as bridges (shorts) on the one side or breaks on printed circuit boards on the other side. The device comprises processing tanks (2) for the treating of work pieces and a conveyor system for the transport thereof. The conveyor system comprises at least one transport carriage (18), at least one holding element (14, 25) and at least one connection means (12, 13, 35) between the transport carriage(s) and the holding element(s). The processing tanks adjoined with a clean room zone (3). The work pieces are conveyed through the clean room zone using the conveyor system.

18 Claims, 7 Drawing Sheets

(56) References Cited

U.S. PATENT DOCUMENTS

| | | | | |
|---|---|---|---|---|
| 4,423,211 | A * | 12/1983 | Bagner et al. | 536/16.9 |
| 4,425,211 | A | 1/1984 | Birkle et al. | |
| 4,755,273 | A * | 7/1988 | Bassett et al. | 204/622 |
| 4,759,831 | A * | 7/1988 | Birkle et al. | 205/237 |
| 5,074,104 | A * | 12/1991 | Desjonqueres et al. | 53/510 |
| 5,139,459 | A * | 8/1992 | Takahashi et al. | 454/187 |
| 5,334,246 | A * | 8/1994 | Pietrzykowski et al. | 118/69 |
| 5,364,219 | A * | 11/1994 | Takahashi et al. | 414/217 |
| 5,451,429 | A * | 9/1995 | Chapman | 427/250 |
| 5,468,111 | A * | 11/1995 | Flint et al. | 414/416.08 |
| 5,746,008 | A * | 5/1998 | Yamashita et al. | 34/211 |
| 5,827,410 | A * | 10/1998 | Hosten | 204/198 |
| 5,901,997 | A * | 5/1999 | Bayer | 294/115 |
| 6,019,563 | A * | 2/2000 | Murata et al. | 414/222.01 |
| 6,070,636 | A * | 6/2000 | Zaher | 156/540 |
| 6,153,064 | A * | 11/2000 | Condra et al. | 204/198 |
| 6,238,283 | B1 * | 5/2001 | Matsuyama et al. | 454/187 |
| 6,251,551 | B1 * | 6/2001 | Kunze-Concewitz | 430/22 |
| 6,530,385 | B2 * | 3/2003 | Meuris et al. | 134/25.4 |
| 6,679,672 | B1 * | 1/2004 | Barrows | 414/217 |
| 6,725,561 | B2 * | 4/2004 | Link et al. | 34/60 |
| 6,852,166 | B2 * | 2/2005 | Kinoshita et al. | 118/423 |
| 7,022,451 | B2 * | 4/2006 | Kinoshita | 430/127 |
| 7,279,067 | B2 * | 10/2007 | Yoshida et al. | 156/345.32 |
| 7,441,999 | B2 * | 10/2008 | Nakao et al. | 414/217.1 |
| 7,771,150 | B2 * | 8/2010 | Hugler | 414/217 |
| 7,776,192 | B2 * | 8/2010 | Erbkamm et al. | 204/298.07 |
| 8,225,741 | B2 * | 7/2012 | Dixon et al. | 118/428 |
| 8,539,907 | B2 * | 9/2013 | Hsu et al. | 118/429 |
| 2003/0198541 | A1 * | 10/2003 | Davis et al. | 414/217 |
| 2004/0009670 | A1 | 1/2004 | Preusse et al. | |
| 2004/0126208 | A1 * | 7/2004 | Tawyer et al. | 414/222.02 |
| 2005/0045214 | A1 * | 3/2005 | Davis et al. | 134/78 |
| 2005/0135906 | A1 * | 6/2005 | Fosnight et al. | 414/277 |
| 2006/0076241 | A1 | 4/2006 | Schneider et al. | |
| 2007/0037399 | A1 * | 2/2007 | Luetge et al. | 438/745 |
| 2009/0230066 | A1 * | 9/2009 | Schaerer | 211/60.1 |
| 2011/0011335 | A1 * | 1/2011 | Thie et al. | 118/58 |
| 2012/0312229 | A1 * | 12/2012 | Pei | 118/56 |

FOREIGN PATENT DOCUMENTS

| | | |
|---|---|---|
| DE | 10228998 | 1/2004 |
| EP | 0 072 968 A2 | 3/1983 |
| EP | 1 510 600 A1 | 3/2005 |
| JP | 5003240 A | 1/1993 |
| JP | 11315383 A | 11/1999 |
| JP | 2003034876 A | 2/2003 |

\* cited by examiner

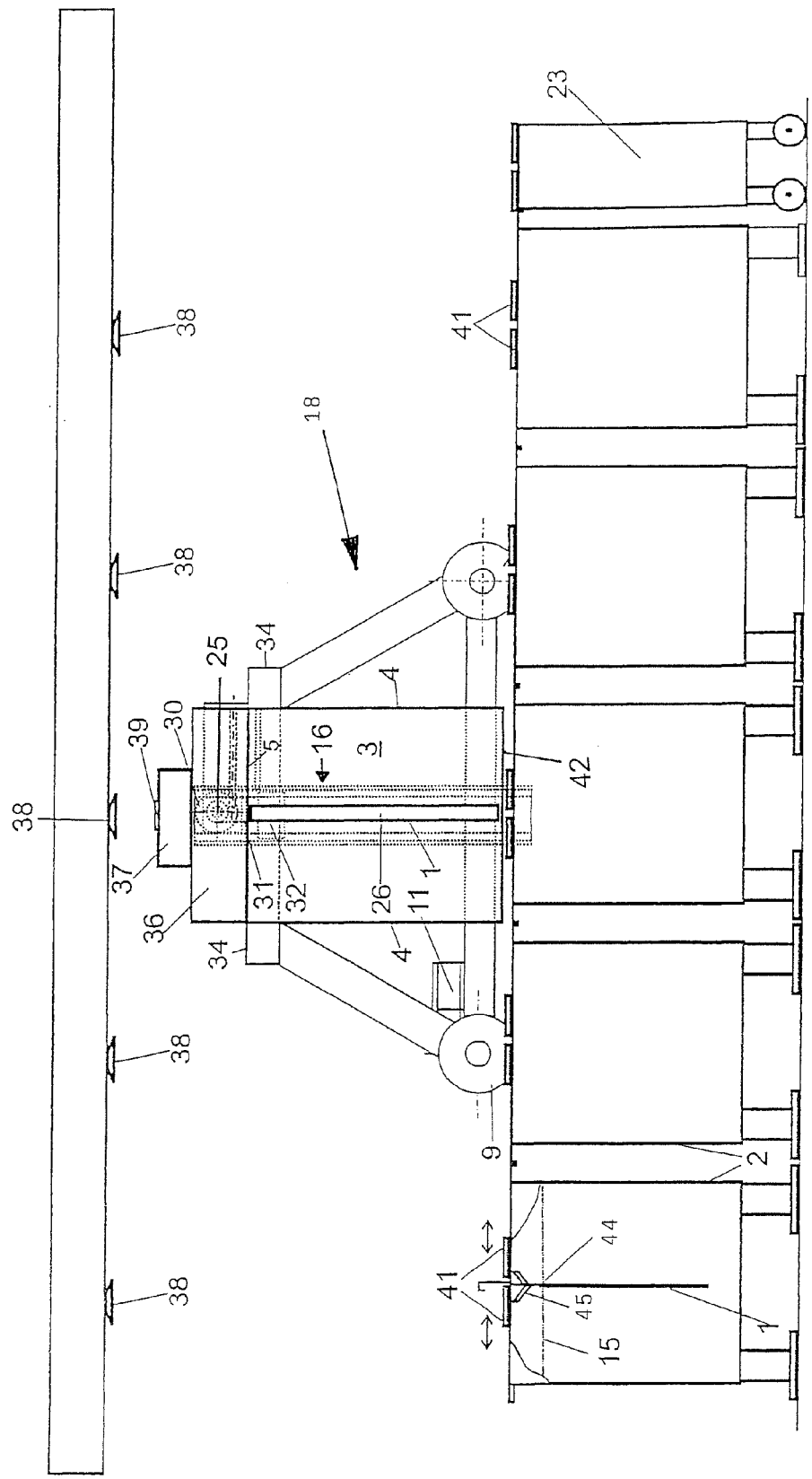

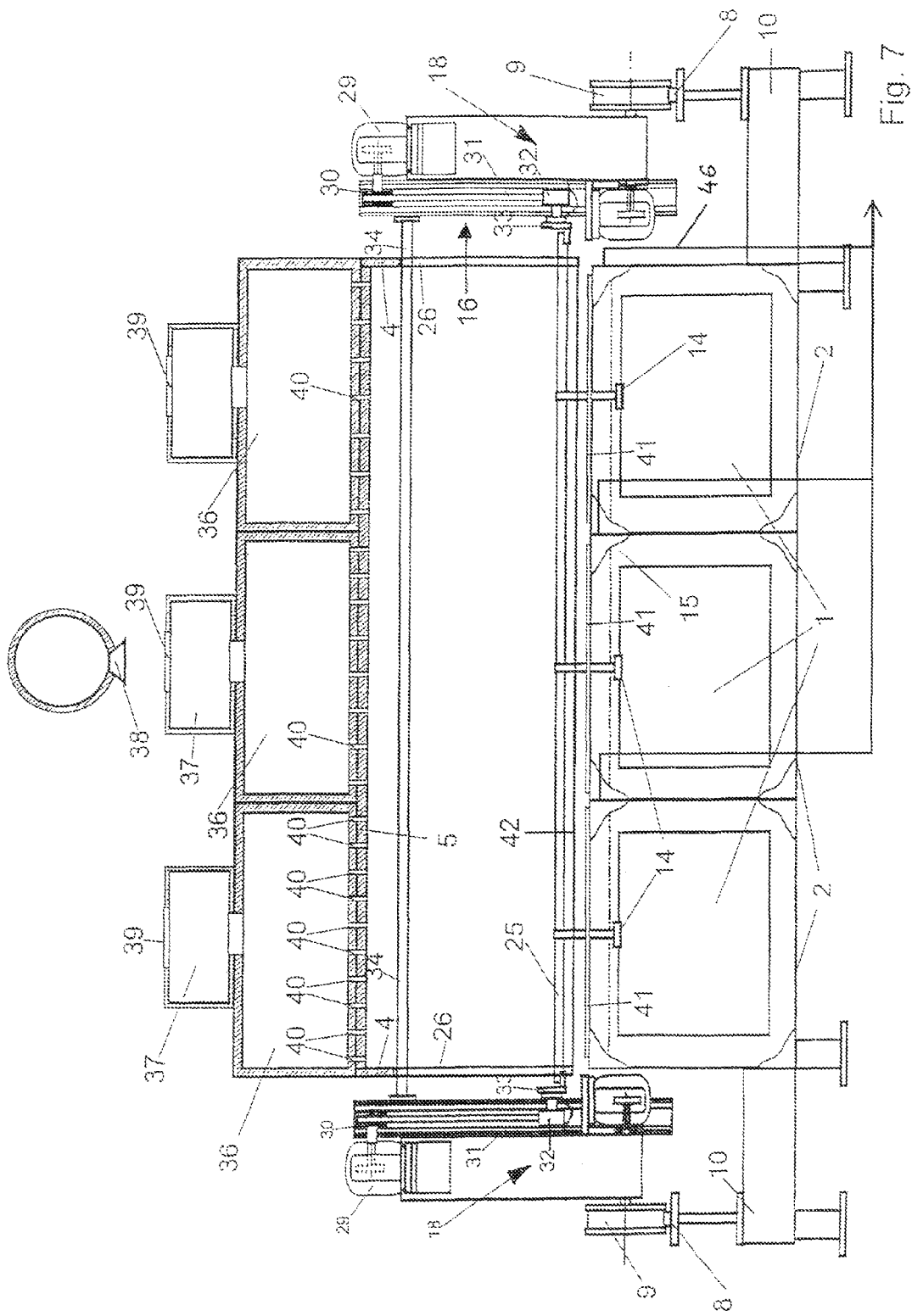

DEVICE AND METHOD FOR CHEMICALLY AND ELECTROLYTICALLY TREATING WORK PIECES USING A CONVEYOR SYSTEM TO TRANSPORT WORK PIECES BETWEEN TREATMENT TANKS

The present invention relates to a device and a method for chemically or electrolytically treating work pieces, preferably flat, highly sensitive work pieces in the printed circuit technique, more specifically work pieces for which it is essential to have smooth surfaces or finest structures as they are for example required for next generation flip chip substrates, and to the use of said device.

In the semiconductor industry, the chip manufacturers are preparing to release what they call 90 nanometer structures. They are planning even smaller structures of 70 nm. But even these dimensions are only intermediate steps on the way to ever smaller structures. In view of the increasing miniaturization of semiconductor parts, the manufacturers of printed circuit boards having chip carriers are confronted with new challenges they attempt to meet by adapting their products to the new conditions. This means that they have to meet for example demands for structure dimensions of presently about 150 µm for pad pitches and of about 75 µm for lands in order for them to survive on the market. It is contemplated that this trend of miniaturization will most likely continue in the near future.

Such type fine structures however can no longer be realized using the current methods and devices. It was observed that an attempt to reduce the size of the structures resulted in irregular contours of the circuit structures produced, pads and lands, and even in bridges (shorts) on the one side or breaks on the other side. It has further been found out that the surface of the metallized structures often is uneven. Such unevenness may interfere with soldering in the SMD technique and in direct bonding of semiconductor chips. As a result, the contact established may be insufficient, rendering the work piece useless. Irregular contours are also unacceptable since the electric properties of the manufactured circuits would thus be unpredictably compromised. Breaks in the structures and shorts between neighbouring structures are of course also unacceptable as they cannot be repaired subsequently so that the circuits have to be rejected.

It has been known to use a surface treatment plant, more specifically electroplating plant, from DE 83 28 191 U1. This plant comprises a plurality of processing tanks and a transducer for moving work pieces from one tank to the other and a drive for the transducer in a horizontal direction alongside the processing tanks as well as in a vertical direction. The plant further comprises a protective cabin that covers the tanks and that is provided with an opening through which a hoisting arm of the transducer passes through. Though the protective cabin serves for preventing impurities from falling into the tanks, this plant however has not proven to solve the problems described herein above.

It is therefore an object of the present invention to provide a device and a method for treating, more specifically coating, work pieces that permit to produce finest circuit structures and particularly smooth surfaces on the work pieces, thereby avoiding the above described problems of prior art devices. Moreover, the contour of the circuit structures shall be smooth and as reproducibly adjustable as possible. It is particularly important that the investment cost for the device and for the running operation be kept low in order to ensure an economically sensible production.

This and other objects of the present invention are realized by the embodiments described and claimed herein and shown in the appended drawings.

The singular form of certain terms such as conveyor system, transport carriage, motion drive, transport carriage chassis, hoisting gear, receiving device, carrier arm, flight bar, holding element, clean room housing, loading and discharge station, entrance opening and pipeline system as used in the description herein below and in the claims shall, where indicated in the description and in the claims, be taken to likewise alternatively include the plural form of the same terms. The plural form of certain terms such as work pieces, gripper elements, flight bars, traverse members, lifting mechanisms, lifting piston/cylinder systems, lead-through openings, brushes, sealing lips, covers, inlet slots, inner spaces of the tanks and treatment baths, shall, where indicated in the description and in the claims, be taken to likewise alternatively include the singular form of the same terms.

The device and the method of the invention permit to produce, preferably on flat work pieces, particularly smooth surfaces and finest structures, for example in the range of 75-150 µm for lands or pad pitches and lower, or to treat these structures, while providing at low cost clean room conditions for the work pieces as they are known to be provided, but at a much higher cost, in the semiconductor technique.

Tests permitted to find out that the flaws mentioned (irregularities on the metallized structures, irregular contours of the circuit structures as well as breaks or shorts) are caused by dust particles in the ambient air or by other minute impurities. Because of the miniaturization of the structures, said dust particles or minute impurities on the electroplating devices may result in scrap of the work pieces.

For it has been observed that the dust particles will deposit on the structures, leading to impurity inclusion during the electroplating process. This may cause shorts or other undesired defects in the work pieces. The shape of the metallized areas may thus be undesirably altered, e.g., become uneven, interfering with soldering in the SMD technique and with direct bonding of semiconductor chips. As a result, the contact established may be insufficient, rendering the work piece unusable.

More specifically, substances such as dust or other minute ambient impurities are to be prevented from entering the processing space of the device to hinder deposition of said substances onto the work pieces during processing or during transport.

The work pieces which are preferably electrolytically or chemically treated are printed circuit boards and chip carriers on printed circuit boards. Electrolytic or chemical treatment serves to either deposit metal such as copper, gold, nickel, tin, silver or the alloys thereof onto the work pieces or to completely or partially remove metal layers from said work pieces.

The device of the invention for chemically or electrolytically treating work pieces comprises at least one processing tank for processing the work pieces and at least one conveyor system for transporting the work pieces. The at least one processing tank is directly adjoined with at least one clean room zone such that the work pieces may be conducted through the at least one clean room zone by the at least one conveyor system. The device further comprises means to establish an overpressure in the at least one clean room zone relative to ambient pressure (e.g., at most 5 Pa, more preferably at most 10 Pa and most preferably at most 50 Pa overpressure relative to ambient pressure).

In the event a plurality of processing tanks are provided, these may contain identical or different treatment liquids or serve for drying, tempering or for loading or discharging. The processing tanks may be disposed in rows side by side and/or one behind the other to form processing units. In these units, the work pieces, for example a plurality of printed circuit boards, may be processed simultaneously side by side, although preferably in separate processing tanks containing the same treatment liquid. After treatment, said printed circuit boards, which are disposed side by side, may be conveyed for further treatment to the next processing station equipped with a plurality of tanks arranged side by side. As a result, an entire sequence of processing steps such as rinsing, electroplating, rinsing and subsequent drying may be carried out. The clean room zone may thereby extend over all of the processing tanks or be separately associated with a respective one of the processing tanks.

The clean room zone is preferably spatially defined by clean room housings each comprising at least one lead-through opening. The housing more specifically may comprise side walls, front walls, top walls and bottom walls. In a preferred embodiment, the housing may consist of a pair of confronting side walls, a pair of confronting front walls, a top wall and a bottom wall. In another embodiment, the underside of the housing may also be formed by the processing tanks adjoining immediately there beneath; with the transition between the clean-room zone and the tanks being free or with a cover for the work pieces that may comprise narrow entrance openings, e.g., inlet slots, for the work pieces being provided there.

The top wall may be supported inside the housing between the lead-through openings by suited reinforcements such as intermediate supports that take their departure from and are supported on the upper edge of the processing tank.

The housing is preferably sealed in such a manner that the gas contained therein which is preferably slightly pressurized is allowed to exit the housing through the lead-through openings only. The lead-through openings may be designed so as to be partially closable. Brushes or elastic sealing lips may for example seal the openings, with said brushes or sealing lips being preferably disposed on the outer side of the housing.

The lead-through openings in the housing may for example be entrance openings for the work pieces, for instance in the region of a loading and discharging docking station, as well as horizontal and vertical lead-through openings for the conveyor system such as for flight bars, lifting mechanisms and traverse members. The lead-through openings are preferably configured to be narrow slots that are suited for feeding the mentioned parts of the conveyor system there through. The housing may be pressurized by introducing therein cleaned, e.g., filtered gas. The gases used may be inert gases such as nitrogen or compressed air that are cleaned by means of suited filters compliant with the clean room class required.

In accordance with the invention, the overpressure generated in the clean room zone prevents undesired substances such as dust or other minute impurities that are outside of the clean room zone from penetrating therein. Such impurities may for example originate from wear debris of the processing device of the invention as well as of ubiquitously present dust originating from the shop. As an overpressure is generated in the clean room zone, not only particles that would fall from the above by the force of gravity may be prevented from attaining to the clean room zone, but also those particles which are so small that they would be moved by any air movement to attain to the clean room zone.

The lead-through openings in the housing walls may for example be disposed in the region of the top wall and/or in one or a plurality of the side walls. The lead-through openings may for example be oriented horizontally in the upper region of the side walls.

The conveyor system may comprise at least one transport carriage, further at least one holding element and at least one connection means between the transport carriage(s) and the holding element(s).

The transport carriage preferably comprises a motion drive and a transport carriage chassis. The transport carriages with the motion drive and the moving gear are preferably disposed outside of the clean room zone. A transport carriage that is moveable on the one long side of a row of tanks may be connected through suited connection means to another transport carriage on the other long side of the row of tanks so as to form a "bridge" connecting the two long sides.

The motion drive is for example a travel motor. The motion drive may for example be disposed on the transport carriage and drive the latter directly through appropriate power transmission means. It may however also be envisaged to mount a stationary motion drive, e.g., on a fixed point of the line, and to move it back and forth by means of an endless chain or cable attached to the moving gear of the transport carriage. The transport carriage may however also be moved backward for example by a spring drive that is tensioned during forward movement so that, in this case, only one drive is needed for each transport carriage.

The transport carriage may also comprise a hoisting gear. Such a hoisting gear serves for example to raise or lower a flight bar. Further, the transport carriage may also comprise a receiving device for a flight bar that can be raised or lowered, for example a carrier arm that can be raised or lowered. Said carrier arms serve to engage beneath the ends of a flight bar for raising the same. For this purpose they may be configured in the shape of a chamfer into which an end of a flight bar will glide. The carrier arms are preferably retained by the hoisting gears of the transport carriage and may thus be moved up and down.

Tests showed that in use certain parts of the conveyor system such as, e.g., the transport carriage with the motion drive, the transport carriage chassis and the hoisting gear, are subject to heavier mechanical wear than other component parts of the device such as, e.g., the gripper elements for grasping the work pieces. This undesired mechanical wear results in contamination of the work pieces that may compromise the quality thereof in the manner described herein above. Accordingly, the conveyor system is preferably arranged such that the largest possible number of parts, and at least the wear-generating motion drive, be located outside of the clean room zone so as to avoid this contamination. Preferably, other parts of the transport carriage, namely the transport carriage chassis and the hoisting gear, are also disposed outside of the clean room zone. Further, the carrier arms for flight bars may be disposed outside of the clean room zone. Generally, all of said parts of the transport carriage may be disposed outside of the clean room zone.

The conveyor system further preferably comprises a holding element for holding the work pieces. The holding element is preferably disposed at least substantially within the clean room zone. The holding element(s) may more specifically be selected from the group comprising gripper elements and flight bars for the work pieces. For example one flight bar and at least one gripper element grasping said flight bar or at least one gripper element for grasping the work pieces only may for example be provided on the conveyor system.

The gripper elements may be configured to be grippers, clamps, tongs, suction cups or the like. The gripper elements may directly grasp individual work pieces. For this purpose, the work pieces are preferably grasped at the edge thereof and placed separately into a respective processing tank for treatment. During treatment of a work piece placed in a processing tank, the conveyor system may collect work pieces from other processing tanks and feed them to yet other tanks. During this transport, the work piece placed in the first tank remains there. In the processing tanks, the various pieces are each separately grasped and retained during treatment.

The work pieces may in turn be fastened to the flight bars where they remain during treatment and transport from one processing tank to the other. In this case, the work pieces are grasped by holding means and retained on the flight bar. The holding means used can be, like the gripper elements, for example grippers, clamps, tongs, suction cups or the like. The gripper elements may also serve to convey flight bars. For this purpose, the flight bars are grasped by the gripper elements and supplied to the several processing tanks into which they are placed and from where they are collected again after treatment. During treatment, the conveyor system may collect flight bars that have been placed for treatment into other processing tanks and transport them to yet other tanks.

Further, connection means are provided between the transport carriage(s) and the holding element(s). Said connection means are preferably located inside, outside of or partially inside and partially outside of the clean room zone. The connection means may be traverse members and/or lifting mechanisms.

The traverse members may be vertically movable (height-adjustable). Like the flight bars, they span one row or several rows of processing tanks. As contrasted with the flight bars to which the work pieces are fastened, the work pieces are not fastened to the traverse members but are merely grasped and retained by them for transport. For this purpose, gripper elements are mounted to the traverse members. With the assistance of the gripper elements, the traverse members hold and convey work pieces either directly or through flight bars. During transport between the various processing tanks, the work pieces are grasped by the traverse members and are placed into the target tank upon arrival so that a traverse member having released work pieces may be moved to another processing station (having a plurality of tanks arranged side by side for example) for collecting work pieces from there. The traverse members are preferably retained by the transport carriage(s) and may be held there more specifically by a hoisting gear on the transport carriage or by the hoisting gears of the transport carriages. If the traverse members are retained on the transport carriages by hoisting gears, they are vertically moveable.

Like the traverse members, the lifting mechanisms are connection means and serve, like the hoisting gears of the transport carriages, to raise the work pieces out of and lower them into the respective processing tanks. The lifting mechanisms can be retained by a traverse member that is not vertically movable and in turn is retained by one or a plurality of transport carriages. These traverse members also constitute connection means. The lifting mechanisms preferably are lifting piston/cylinder systems. They serve to raise the work pieces out of and to lower them into the processing tanks. These lifting mechanisms are retained by the transport carriage(s) through the traverse members. Gripper elements, which are holding elements, are in turn disposed on the lifting mechanisms.

The lifting mechanisms may be used to raise and lower the work pieces, e.g., printed circuit boards. The moving systems on the lifting mechanisms used can be pneumatically or hydraulically actuated lifting piston/cylinder systems with the required gripper elements for holding the work pieces during transport being mounted to the underside of the lifting cylinders.

Besides the simple, low cost lifting piston/cylinder systems, other devices such as motor-driven lifting mechanisms, for example in connection with lifting belts or chains, can also be utilized, though. The impurity particles abraded by friction are however not allowed to enter the clean room zone. For this purpose, a lifting belt may in this case be guided within a lifting rod configured to be a rectangular tube for example so that the particles abraded by friction are prevented from entering the clean room zone.

In a variant of the invention, the conveyor system may comprise a transport carriage on one long side of a row of tanks so that the connection means and holding elements for retaining the work pieces are retained by this one transport carriage only and not by two transport carriages which are located on opposing sides of the row of processing tanks. For example a traverse member may be fastened to the transport carriage, lifting mechanisms may be fastened to the traverse member and gripper elements for the work pieces in turn may be fastened to said lifting mechanisms. In the alternative, one transport carriage may be fastened to a respective one of the two long sides of one row of tanks, a traverse member may be fastened between the two transport carriages, and gripper elements in turn may be fastened to the traverse member. As a matter of course, further transport carriages, which are moveable between two rows of tanks, may also be provided.

Further as a matter of course a plurality of conveyor systems may be provided along a row of processing tanks operating independently of each other while taking care not to collide with each other.

As a result, the following construction concepts for a processing line having a conveyor system comprising transport carriages, holding elements and connection means are obtained:

1) In a first preferred embodiment, the holding elements used for the work pieces are flight bars at which the work pieces are grasped at a loading station and retained through holding means (fastened). In this case, the work pieces may be fastened to the flight bar either directly or through racks. The flight bars are substantially provided inside the clean room zone and may project at the ends thereof out of the clean room zone through the lead-through openings, e.g., through horizontal and vertical slots, in the side walls of the clean room housing. As in this embodiment the flight bars are raised and lowered and are also conveyed from one tank to the other, vertical slots are provided for the vertical movement of the flight bar and horizontal slots for the horizontal movement thereof, with the horizontal slots being preferably disposed in the upper region of the side walls of the clean room zone housing.

During treatment of the work pieces, the flight bars can be laid down for example by the ends thereof, which are located outside of the clean room zone. For transport, the flight bar is again picked up by receiving devices such as carrier arms provided on the transport carriage. Said receiving devices are preferably located outside of the clean room zone. As the ends of the flight bar remain outside of the clean room zone, the risk that fine particles, detaching as a result of vibrations or friction or when the flight bars are being moved and laid down at corresponding routing guides, attain to the clean room zone can be avoided. These routing guides are associated with the individual processing tanks. In the alternative, the flight bar may also be completely located in the clean room zone if the receiving devices project into said zone through the lead-through openings.

The flight bar may be moved by the hoisting gears (vertically) and by the moving gears (horizontally) of the transport carriage located outside of the clean room zone. These hoisting gears carry the receiving devices for the flight bar. For this purpose, guide pieces for vertically moving the carrier arms and, as a result thereof, the flight bar, may for example be provided in the hoisting gear.

The flight bar ends may run in vertical and horizontal slots in the side walls of the clean room housing. For raising and lowering the flight bar, vertical slots are provided through which the ends are threaded. During transport of the flight bar from one processing tank to the other the flight bar ends run in this case in the horizontal slots that are preferably formed in the upper region of the side walls. If the receiving devices project-into the clean room zone and, correspondingly, if the flight bar ends do not project out of it, the horizontal slots likewise serve for the translational motion of the receiving devices. Again, said slots are preferably provided in the upper region of the housing walls. In order to make horizontal travel without flight bar (when running empty) possible, the receiving devices are implemented to be movable so that, for the running empty condition, the receiving devices can be retracted out of the clean room zone in the lower position.

2) In another embodiment, the holding elements are again flight bars that are preferably completely located inside the clean room zone. In this case, the flight bars are grasped and retained by gripper elements inside the clean room zone. To place a flight bar into a processing tank, routing guides are provided at the upper tank edges inside the clean room housing.

The gripper elements are in turn fastened to connection means, namely to lifting mechanisms:

In a first variant, the lifting mechanisms may project out of the clean room zone and may thus be disposed partially inside and partially outside of the clean room zone. The lifting mechanisms may for example be configured in the shape of telescopically engaging lifting pistons and cylinders. During transport by means of transport carriages, the lifting mechanisms are in this case passed through the lead-through openings, in the present case horizontal slots formed in the top wall of the clean room housing. As for the lifting mechanisms, they are retained by further connection means, namely by traverse members. In this case, the traverse members are disposed outside of the clean room zone above the clean room housing. The traverse members are fastened to the transport carriage. They are not vertically movable since vertical movement needed for the work pieces is effected by the lifting mechanisms.

In a second variant, the lifting mechanisms may be disposed completely inside the clean room zone. In order to limit the overall height of the clean room housing, the lifting mechanisms may again for example be configured in the shape of telescopically engaging lifting pistons and cylinders. In this variant, the lifting mechanisms are fastened to a traverse member that is disposed at least substantially inside the clean room zone. At the ends thereof, the traverse-member projects out of the clean room zone. For this purpose, the ends are passed through horizontal slots formed in the upper region of the side walls of the clean room housing and out of the clean room zone. As in this embodiment the traverse member is not vertically movable either, there is no need to provide for vertical slots in the side walls. To increase the stability of the housing, the top walls of the housing may in this case preferably be fastened to the shop's ceiling.

For transporting the work pieces, the transport carriage with the traverse member having the lifting mechanisms and gripper elements fastened thereon is moved to a flight bar placed in a processing tank and grasps it. The flight bar is lifted out of the processing tank by the lifting mechanisms and is conveyed to another processing tank in the raised position by the translational motion of the transport carriage. By lowering the flight bar in the new position by means of the lifting mechanisms, the flight bar is placed into the target tank. Upon placement of the flight bar into said processing tank, the transport carriage with the traverse members, the lifting mechanisms and the gripper elements may be moved to another processing tank to collect therefrom another flight bar.

3) In another embodiment, the holding elements again are flight bars. The flight bars are grasped with the assistance of connection means, namely traverse members, and of gripper elements fastened thereon and then conveyed from one processing tank to the other. The flight bars and the gripper elements may completely be disposed inside the clean room zone, the flight bars be deposited on routing guides which are likewise disposed inside the clean room zone. In the alternative, at the ends thereof, the flight bars may also engage through the side walls of the clean room housing and be placed there onto routing guides. So far, this embodiment does not differ from the one described before. In both cases of this embodiment, the traverse members are also disposed at least substantially inside the clean room zone. In this embodiment, the ends thereof project out of it. As contrasted with the embodiment described above, the traverse members may be raised and lowered, though, and are thus vertically movable. For this purpose, the traverse members are held by a hoisting gear on the transport carriage that is disposed outside of the clean room zone. Accordingly, the ends of the traverse members are in this embodiment solidly connected to the hoisting gears of the transport carriage. If the ends of a flight bar project out of the clean room housing through the side walls thereof, it is necessary, in order to transport the flight bar, that the height at which the traverse member is positioned be the same as that of the flight bar protruding from the clean room zone so that the flight bar and the traverse member are allowed to run in the same horizontal slot. Otherwise two horizontal slots in the side walls at different heights would have to be provided. This, however, would impose a considerable design-engineering challenge.

During raising and lowering, the traverse members are threaded through vertical slots formed in the side walls of the clean room housing. As the traverse members are moved from one processing tank to the other, they are threaded through and run in horizontal slots in the upper region of the side walls. If the flight bar ends also protrude from the clean room housing, they are also threaded through and run in said horizontal slots.

4) In another preferred embodiment, the holding elements are mere gripper elements for the work pieces. In this case, flight bars are eliminated. The work pieces are directly grasped by the gripper elements. To place the work pieces into the processing tanks suited holding devices for picking up the work pieces in the tanks and for holding those during treatment are provided in the tanks. Upon completion of the treatment, these holding devices release the work pieces. Such type holding devices may for example be holding frames which, in the case of electrolytic treatment, may also serve to supply an electric current to the work pieces.

The gripper elements are fastened to traverse members (connection means) that may be raised and lowered. The traverse members are located substantially inside the clean room zone. The ends thereof protrude therefrom. The traverse members are threaded through horizontal slots and vertical slots through the side walls of the clean room housing.

The horizontal slots serve to convey the traverse members with the gripper elements and the work pieces fastened thereon from one processing tank to the other. Each vertical slot is disposed in the region of and above the processing tanks and serves to raise and lower the traverse members, gripper elements and work pieces. Like in the embodiment described herein above, the traverse members are again fastened to hoisting gears on the transport carriage disposed outside of the clean room zone. The traverse members may be raised and lowered with these hoisting gears.

5) In still another embodiment, which has no flight bar, the work pieces are directly grasped by the gripper elements and placed into the processing tanks. The gripper elements are located completely inside the clean room zone. The gripper elements are fastened to a traverse member that cannot be raised and lowered. Lifting mechanisms are provided for raising and lowering the work pieces and the gripper elements. The traverse members and the lifting mechanisms are connection means. The traverse members are not vertically movable.

In a first variant of this embodiment, the traverse members may be located substantially inside the clean room zone and protrude therefrom at the ends thereof only. In this case, the lifting mechanisms are located completely inside the clean room zone. In order for the traverse members to be moveable, lead-through openings in the form of horizontal slots through which the traverse members extend are preferably provided in the upper region of the side walls of the clean room housing.

In a second variant, the traverse member is caused to move outside of the clean room zone only above the clean room housing. In this case, the lifting mechanisms are located partially inside and partially outside of the clean room zone. In this case, a horizontal slot through which the lifting mechanisms are threaded is provided in the top wall of the housing.

In all of the embodiments described herein above, the work pieces or a flight bar are grasped for transport, are lifted out of a processing tank and are conveyed to another processing tank. There, the work pieces are treated. With respect to the work pieces, this procedure may be repeated until the work pieces have been conveyorized through all of the processing tanks and until treatment of the work pieces is completed.

In order to load the work pieces into the clean room zone, there may be provided outside of the clean room zone at least one loading and discharging station from which the work pieces are conveyed into the clean room zone through an entrance opening in the housing. The entrance openings may be implemented to be closable. Closing means such as screens, gate valves or covers may for example be used for closing the entrance openings during treatment of the work pieces. The closing means are preferably disposed on the external side of the housing in order to avoid mechanical wear during actuation thereof in the clean room zone. The loading and discharging station comprises a closure mating the entrance opening of the housing for the transfer of the work pieces. The loading and discharging station is preferably specifically designed to prevent dust particles initially adhering to the work pieces from attaining to the clean room zone.

In a preferred embodiment of the invention, a conveyor system comprises two transport carriages that are disposed laterally outside of the housing. Each transport carriage comprises a motion drive and a transport carriage chassis. The transport carriages may travel on conveying paths, e.g., on rails, extending parallel to the rows of tanks. In embodiments in which a flight bar or traverse members that are vertically movable are used, there may be provided a hoisting gear that may be directly flanged to the transport carriage chassis. The hoisting gear preferably comprises a vertically moveable lifting cradle possessing for example a guide piece. Receiving devices by means of which a flight bar protruding from the lead-through openings can be lifted from the outside of the clean room zone and then transported may for example be fastened to the guide piece. In the alternative, traverse members may be fastened to the guide pieces. If the work pieces are still in a loading and discharging station, they are grasped there and conveyed from there to the processing tanks.

Narrow slot-shaped lead-through openings may be provided in the side walls for transport. Vertical lead-through openings existing in the side walls are oriented, taking departure from the processing tanks, preferably vertically upward where they meet horizontal lead-through openings, e.g., horizontally oriented slots, which are oriented substantially along the entire length of a conveying path of the transport carriage above the processing tanks. If flight bars are for instance used as holding elements that are picked up by receiving devices, conveyed and lowered again, the ends of the flight bars engage through the slots during transport of the work pieces. During hoisting, the ends of the flight bars extend through the vertical slots in the side walls in which they move vertically upward. Once the upper position, the so-called travelling position, is reached, the transport carriage chassis may move a flight bar forward or backward. In the raised position, the ends of the flight bar protruding through the side walls of the housing run in the horizontal slot formed in the upper region. Upon reaching the target processing tank for the next processing step, the conveyor system lowers the flight bar at this very place. The ends of the flight bar with the work pieces thereby glide downward in the vertical slot formed there.

Since any process sequences are to be performed, such type devices with flight bars and receiving devices are also capable of running empty. This means that the transport carriage puts one flight bar down at a processing tank, then runs empty to the next one where it picks up a flight bar located there for further transport. In this embodiment, the transport carriage may also run empty with the hoisting gear being in the lower position if the receiving devices at the hoisting gear of the transport carriage are located outside of the clean room zone or if the receiving devices be retracted out of the clean room zone during the movement of the transport carriage. In this case, there is no need for lower slots in the side walls of the housing. The usual possibilities for conveying the work pieces may still be used. However, it would be almost impossible to form additional lower horizontal slots because there is no possibility to fasten the side walls at the bottom.

Further, the work pieces may be conveyed by means of conveyor systems that comprise outside of the housing on either side thereof one transport carriage with motion drives and hoisting gears disposed thereon, with the work pieces being conveyed without any flight bar. For this purpose, there is provided a traverse member which is substantially disposed in the clean room zone and which is solidly connected to the two left and right motion drives or hoisting gears, respectively, of the transport carriage extending along the clean room housing on either side thereof. Individual gripper elements for each work piece are located on this traverse member, said gripper elements remaining open as the traverse member is being lowered so as to be capable of directly grasping the work pieces from the top. For transporting the work pieces, each gripper element mounted to the traverse member is closed in the lower position so that the respective one of the work pieces is secured by clamping, lifted out of the processing tank and conveyed to the next processing tank.

The slots in the side walls of the housing of the clean room zone correspond to the embodiment already described herein above making use of a flight bar. If it is desired that the transport carriage runs empty, the traverse member on the transport carriage must however be brought into the upper hoisting position in order to attain the next processing tank of concern using the horizontal slot disposed at the top in the side walls. The traverse member may be lowered with the gripper elements being opened and the work pieces be grasped in the lower position. As soon as the work pieces have been grasped, the next transport procedure is carried out with the traverse member being hoisted to the upper position and then moved further to the next processing tank.

In the two last described embodiments, further cross bracings for stabilizing the transport carriages or the two hoisting gears and moving gears of the transport carriage, respectively, and for improved synchronization of the travelling motion may be provided between the transport carriages of the conveyor system to provide them with rigidity and stability. The position of the cross bracings must thereby be selected so that they are capable of freely moving in the horizontal slots of the side walls formed on either side. In the upper position, the traverse members with the gripper elements which serve as connection means or the flight bars shall therefore preferably also move in these slots. The work pieces, being grasped by traverse members that are raised and lowered using hoisting gears, are conveyed in a similar manner.

Since the sites on all of the moved parts that are likely to wear are for the major part disposed outside of the clean room zone, low clean air consumption is ensured at a low overpressure (e.g., at most 5 Pa, more preferably at most 10 Pa and most preferably at most 50 Pa overpressure relative to ambient pressure) so that it is made certain that the line may be operated economically.

In a preferred embodiment of the invention, the size of the clean room zone may be reduced if it does not extend simultaneously over all of the processing tanks. This is possible if the processing tanks are closed during treatment and are only opened for loading and discharging. In this case, it is sufficient if the clean room zone is provided on the very transport carriage only. For this purpose, a transport carriage is provided with a housing that is closed at the top, at the front, at the back and on the sides. At the bottom, the housing is open at least while the processing tanks are being loaded and discharged. It is however preferred that the housing be provided with a bottom wall having corresponding openings for the work pieces to pass there through. In this case again, all the drives for conveying the work pieces are located outside of the clean room zone.

In order for the clean room zone to be supplied with the appropriate cleaned air, cleaning means for the gas such as filters and fans are located above the clean room zone. The fans draw unfiltered air from above the transport carriage and force it via corresponding openings through the filters into the clean room zone. For this purpose, openings that coincide with the filters may be provided in the top wall. When conducting the air and when selecting and disposing the openings, achievement of as laminar as possible a flow should be a major concern. To assist the air in flowing from the top downward, suction means are also provided on the processing tanks, said suction means concurrently ensuring removal of the chemical vapours generated in the baths.

In order for the filters serving to produce clean air not to have to be exchanged too often, a fresh air duct having distribution openings for supplying pre-cleaned fresh air may be mounted directly above the transport carriage. Once the transport carriage with the housing has reached the processing station to collect already processed work pieces or to put down work pieces still to be processed, the transport carriage stays for a short while above the processing tank in order to replace possibly contaminated air in the immediate environment thereof by the clean air supplied by the fans to the clean room zone. Then, the cover of the processing tank may be opened and the processed work pieces drawn through an entrance opening into the housing of the clean room zone or placed into the tank.

To load the processing tank, the work pieces in the clean room zone may be lowered through the entrance opening after the cover of the processing tank has been opened. This embodiment of the invention provides the particular advantage that clean air needs only to be generated in quite small quantities.

The above provisions to generate clean air and to provide such cleaned air into the clean room zone may also be applied to the stationary arrangement of the clean room housing disposed on the processing tanks.

In all the embodiments described herein above, sealing lips or rows of brushes that additionally seal the clean room zone and are only pushed aside upon passage of the parts of concern (e.g., the lifting rods of the lifting piston/cylinder system, the flight bars, the traverse members) may be disposed on one side or on either side of the slots in the walls of the housing of the clean room zone. This may contribute to further reduce the consumption of clean air which has to be filtered at high cost.

A particular benefit of the embodiments of the laterally disposed transport carriages with moving gear is the low overall height of the device so that it may be accommodated in low rooms as well.

If treatment is to be electrolytic, preferably the current is not supplied to the work pieces through the flight bars like in conventional processing devices, but preferably rather through devices stationarily mounted in the baths such as through contact frames grasping the edges of the work pieces. Such type contact frames are described in further detail in DE-A 102 41 619 for example, this document hereby being incorporated by reference. The contact frames may comprise contact strips for electrically contacting the work pieces at the substantially opposing side edges of the work pieces.

To lower the cost, the transport carriages may be manufactured in a modular manner. To allow maintenance works, windows may be provided in the housing of the clean room zone for fast and easy access to the installations in the housing and at need to the processing tanks.

The described devices of the invention for chemically or electrolytically treating work pieces may be preferably used in vertically conveyorized chemical or electrolytic plating lines.

The invention will be understood better upon reading the following non restrictive description given with reference to the Figures.

All of the Figures are schematic and not to scale. In the drawings:

FIG. 6 is a sectional side view of a particularly preferred embodiment of the invention similar to FIG. 5;

FIG. 7 is a front view of the device of the invention as shown in FIG. 6.

Like numerals are used in the Figures to denote like elements.

Figure 1:
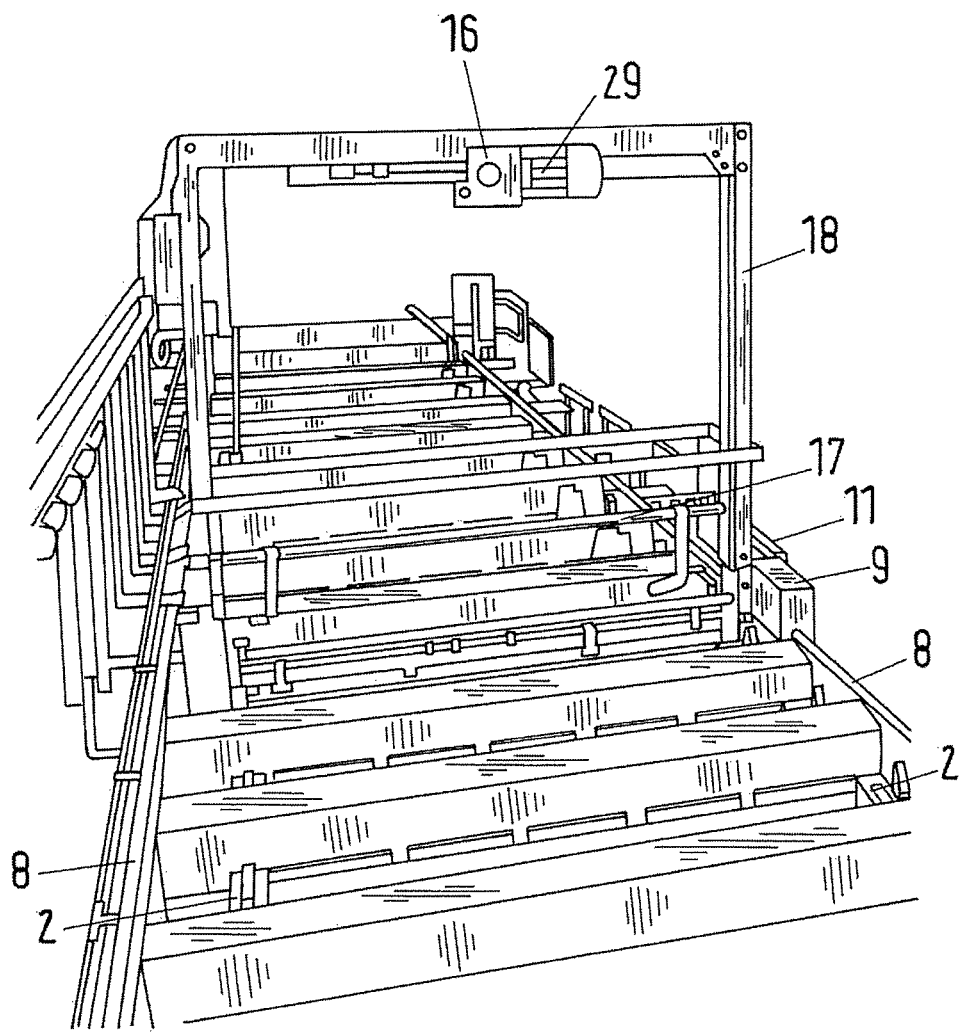
FIG. 1 shows a prior art device.

FIG. 1 shows a prior art device for treating the surface of pieces. Such type devices consist of a certain number of processing tanks 2 that are arranged one behind the other to form a row of tanks. Laterally to the row of tanks, there are located rails 8 on which transport carriages 18 with moving gears 9 that are driven by travel motors 11 are moved from one processing tank to the next. Each transport carriage is provided with a hoisting gear 16 mounted to a traverse member for moving a lifting beam 17 up and down. Flight bars (not shown) can be fastened to the lifting beam with racks holding the work pieces or with tongs for directly fastening the work pieces being attached to said flight bars. The hoisting gear serves to raise and lower the work pieces out of and into the processing tank which is open toward the top.

Figure 2:
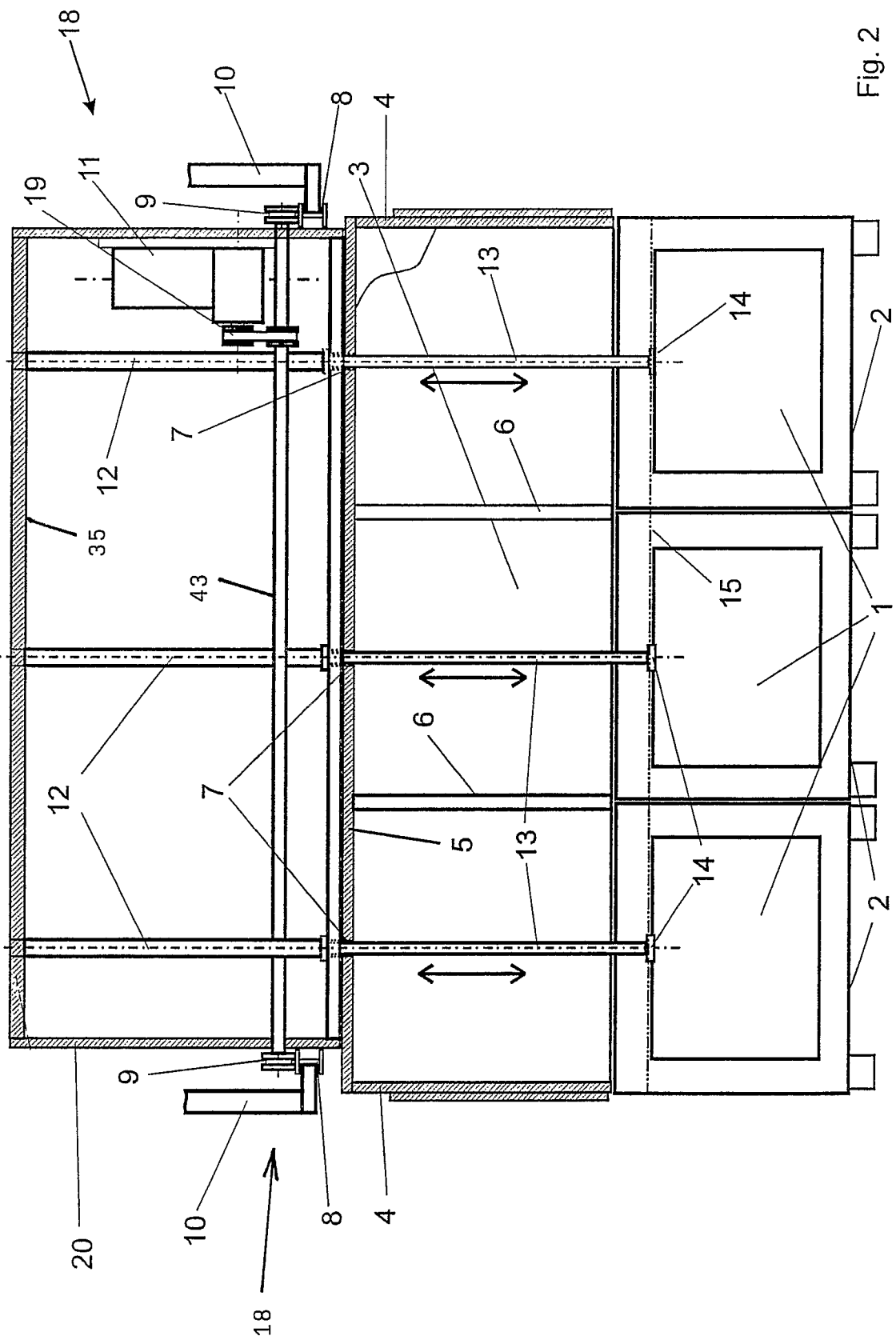
FIG. 2 is a front view of a preferred embodiment of the device of the invention taken along section line A-A' of FIG. 3.

FIG. 2 is a sectional front view of a preferred embodiment of the device of the invention. At the bottom of FIG. 2 there are shown three processing tanks 2 disposed side by side, each containing a work piece 1. Here, the work pieces are fastened to gripper elements 14. As shown in FIG. 1 for several processing tanks, further processing tanks extend deep into the plane of the drawing (not shown) so that three rows of tanks are formed side by side. The work pieces are lowered into the processing tanks so as to be beneath the bath level 15 and to be completely covered with the treatment liquid contained in the tanks. At the top thereof, the processing tanks are immediately adjoined with the clean room zone 3. The zone is defined by a housing consisting of gas-tight side walls 4, front walls (not shown) and a top wall 5. The top wall is supported by intermediate supports 6 supported between the rows of tanks. The side walls, front walls and the top wall almost completely seal the clean room 3 from the outside. At the bottom, there is no wall provided, but the housing is closed by the processing tanks.

Figure 3:
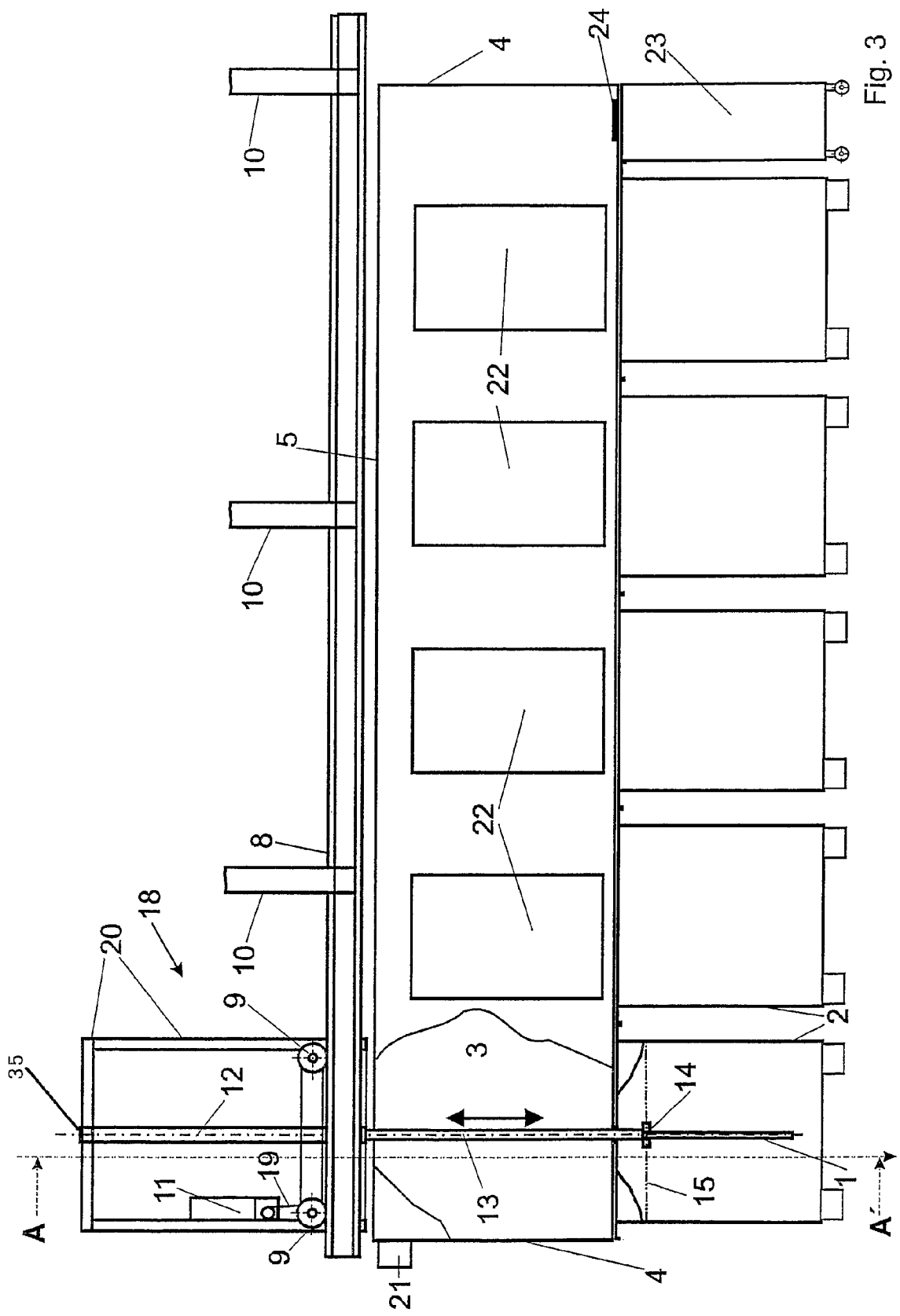
FIG. 3 is a side view of the device of FIG. 2.

The work pieces 1 may be conveyed to the clean room zone 3 by means of a loading and discharging station 23 configured in the shape of a protective transport container (see FIG. 3). The protective transport container permits to protect the work pieces against the contaminated ambient air. To transfer the work pieces into the clean room zone, the transport container is pushed beside the processing tanks where it is locked before the work pieces are transferred to the clean room zone through a closure of the transport container and an entrance opening/lock 24 of the housing by means of the conveyor system.

Transport carriages 18 (FIG. 2), which comprise transport carriage supporting frames 20 and transport carriage chassis 9, run alongside and above the clean room zone 3. The two transport carriages are connected together by a traverse member 35. The direction of travel of the transport carriages leads respectively into the plane of the drawing and out of it. On either side of the clean room zone there are provided rail carriers 10 and rails 8 for the transport carriage chassis to allow travelling motion of the transport carriages. The transport carriage chassis are driven for example by a travel motor 11 employed as the motion drive, for example through cog belts 19 that transmit the power onto an axis 43 connecting the transport carriage chassis.

The traverse member 35 on the transport carriage 18, which is not vertically movable, is moved over the housing of the clean room zone 3. Lifting piston/cylinder systems, consisting of a lifting cylinder 12 and of a lifting rod 13 each, are associated with the transport carriages via the traverse member. The lifting rods are received inside the respective lifting cylinders when the work pieces 1 are being raised. Only the lifting rods with the gripper elements 14 fastened thereon project into the clean room zone. For this purpose, lead-through openings 7 for passing the lifting rods there through are provided in the top wall 5. Here, the lead-through openings are slots that extend in the direction of travel of the transport carriage so that horizontal slots are formed in the top wall of the housing. After the work pieces have been raised from the processing tanks 2 into the clean room zone, they can be conveyed in the clean room zone from one processing tank to the other.

In order to maintain the clean room conditions in the clean room zone 3, properly filtered gas, e.g., compressed air is constantly blown at overpressure into the clean room zone through lines and connections that have not been illustrated herein. With this overpressure, it is made certain that impurities are prevented from attaining to the clean room zone through the few narrow openings provided. In order to prevent too strong gas movement from being generated inside the clean room, distributing pipes and nozzles ensuring uniform flow through the clean room zone may be provided.

FIG. 3 shows a side view of the device of the invention as shown in FIG. 2 with the section line being denoted A-A' for FIG. 2. Where the various elements have already been described with reference to FIG. 2, they will not be described again with reference to FIG. 3.

To allow maintenance work, windows 22 are provided in the housing of the clean room zone. On the right side of the device, there is the loading and discharging station 23, which is here shown as the protective transport container. It may be moved by means of wheels. In the region of the loading and discharging station, the clean room housing also comprises a bottom wall. In this region, an entrance opening/lock 24 is provided on the housing of the clean room zone 3 and a cover with closure (not shown) is mounted to the protective transport container, which may both be opened after the protective transport container has been docked. Then, the transport carriage 18 may travel to the position of the protective transport container, grasp the work pieces 1 contained in the protective transport container with the gripper elements 14 and lift them out of the protective transport container. Next, the work pieces may be conveyed to the individual processing tanks 2. The protective transport container seals the closure and the entrance opening into the clean room zone until the loading and discharging is completed. As soon as the work pieces have been taken out of the transport container, the closure on the transport container and the entrance opening in the housing are closed again (not shown). Accordingly, it is not necessary to keep the entire production shop under clean room conditions.

The work pieces 1 are raised and lowered in the clean room zone by means of the lifting rod 13. The lifting rod is pushed back into the lifting cylinder 12 disposed on a traverse member 35 by means of compressed air. The work pieces are thereby lifted out of the processing tank 2 and into the clean room zone 3. After that, the transport carriage 18 may continue to travel to another processing tank and lower the work pieces there. By opening the gripper elements 14, the work pieces may be released and put down into provided routing guides (not shown). Thereafter, the transport carriage may run empty to other processing tanks or to the protective container 23, with the lifting rods in the lifting cylinders being pushed back so as not to collide with work pieces placed in other processing tanks.

Cleaned gas can be introduced into the clean room zone 3 through the connecting tubing 21. The required pipes leading to the filter equipment and to the fans are not shown in FIG. 3. In order to avoid strong air movement inside the clean room zone, an air distribution line that has not been illustrated herein may be mounted inside the clean room zone in the direction of travel of the transport carriages.

If the work pieces 1 are to be electrolytically treated in the processing tanks, contact frames that have not been illustrated herein and that are disposed in the respective tanks may grasp the work pieces at the edges thereof after they have been lowered into the processing tanks and connect them to a power supply source that has not been illustrated herein either by means of electrical contacts provided on the frames.

If the work pieces 1 are to be chemically treated, they may be retained in position in the processing tanks 2 for example by slot-shaped guide means mounted on either side of the tanks.

Figure 4:
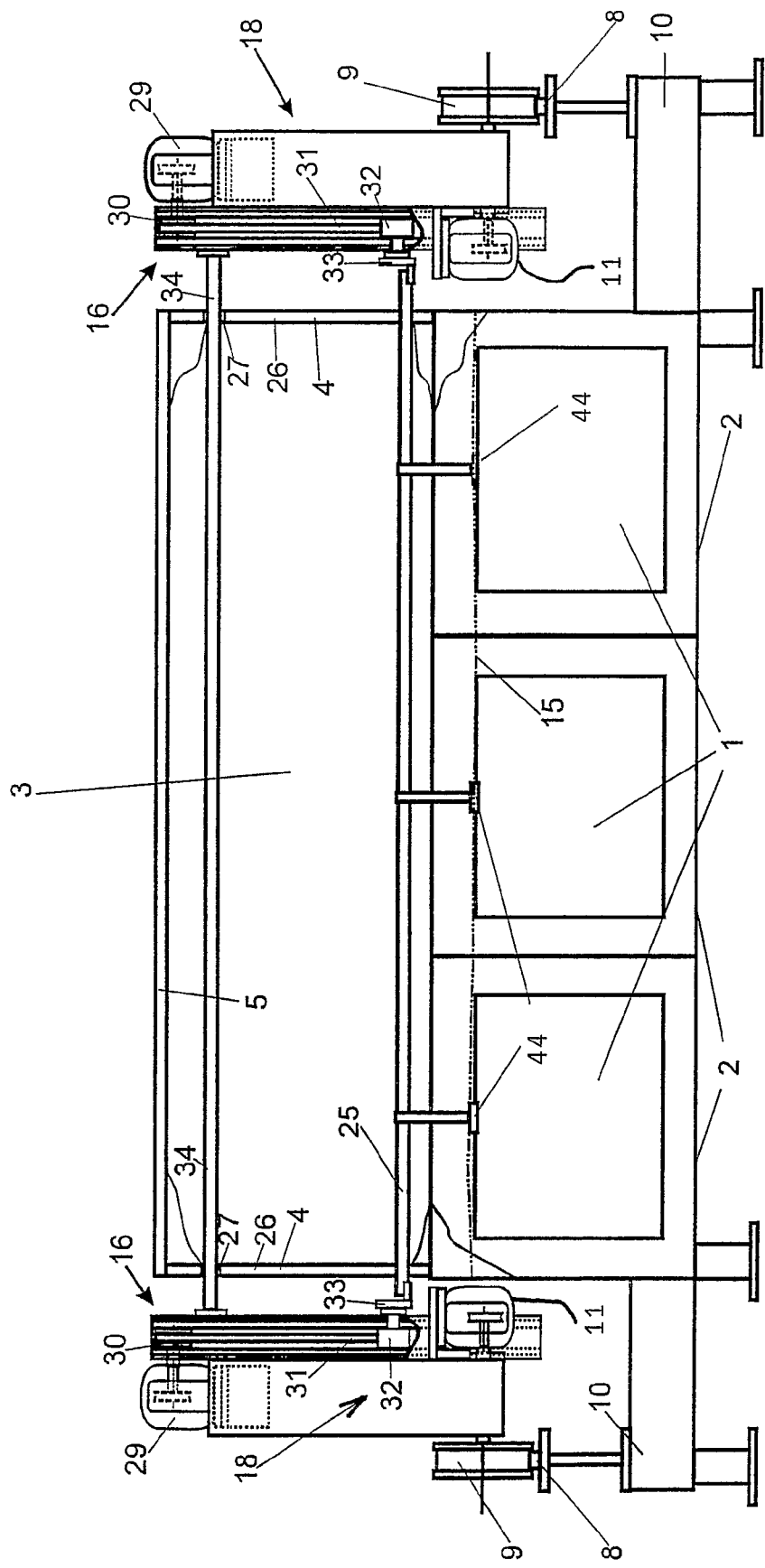
FIG. 4 is a sectional front view of another preferred embodiment of the device of the invention similar to FIG. 2.

FIG. 4 shows a front view of another preferred embodiment of the device of the invention similar to FIG. 2. Here though, the work pieces 1 are not conveyed through a lifting piston/cylinder system having a lifting rod and a lifting cylinder but by means of two hoisting gears 16 that are mounted to a respective one of the transport carriages 18 and cause a flight bar 25 to move. The work pieces are fastened to the flight bar.

In this embodiment of the device of the invention, the side walls 4 forming part of the housing comprise vertical slots (vertical lead-through openings) 26 and one horizontal slot (horizontal lead-through opening) 27 which meet each other in the upper region of the housing. With respect to the length and position thereof, the vertical slots in the side wall are determined at the top and at the bottom by the height of the lift of the hoisting gears 16. The horizontal slot is determined by the upper lift position and by the length of the travelling distance of the transport carriage 18.

Here, the moving gears 9 are driven by one travel motor 11 each, so that the axis (shown in FIG. 2 having numeral 43) is eliminated. On either side, the moving gears run on rails 8 that are fastened to the rail carrier 10. Said rail carrier is in turn supported on the floor of the shop by feet.

The work pieces 1 are fastened to the flight bar 25 by holding means 44. Like the gripper elements, the holding means may be configured to be clamps or clamping screws for example. At either end, the flight bar protrudes from the clean room zone 3 and rests on carrier arms 33 provided on the transport carriages 18 outside of the clean room zone. The carrier arms end in guide pieces 32 of the hoisting gears 16 so that the flight bar 25 may be caused to move up and down by the hoisting gear.

The work pieces 1 may be raised by lifting belts 31 coiling up on lifting belt drums 30 in the hoisting gears 16. Lifting motors 29, which are coupled with their drive axes to the lifting belt drums, serve for coiling and uncoiling. Once the flight bar 25 has reached the upper position, i.e., once the work pieces have been completely lifted out of the processing tanks and into the clean room zone 3, the work pieces can be conveyed by means of the travel motors 11 through the moving gears 9 to the next processing tanks 2 in accordance with the process sequence.

Once the holding position is reached there, the hoisting gears 16 lower the flight bar 25 with the work pieces 1. The flight bar is placed in routing guides (not shown). At the completion of the processing time, the transport carriage 18 again picks up the flight bar in the manner described herein above in order to convey it to the next processing tanks 2.

During the lift, the ends of the flight bar that project through the side walls 4 are running in the vertical slots 26 whereas during the travelling motion, they are running in the horizontal slots 27. Additionally provided cross bracings 34, which support the transport carriages 18 relative to each other, may also be guided in the horizontal slots.

Figure 5:
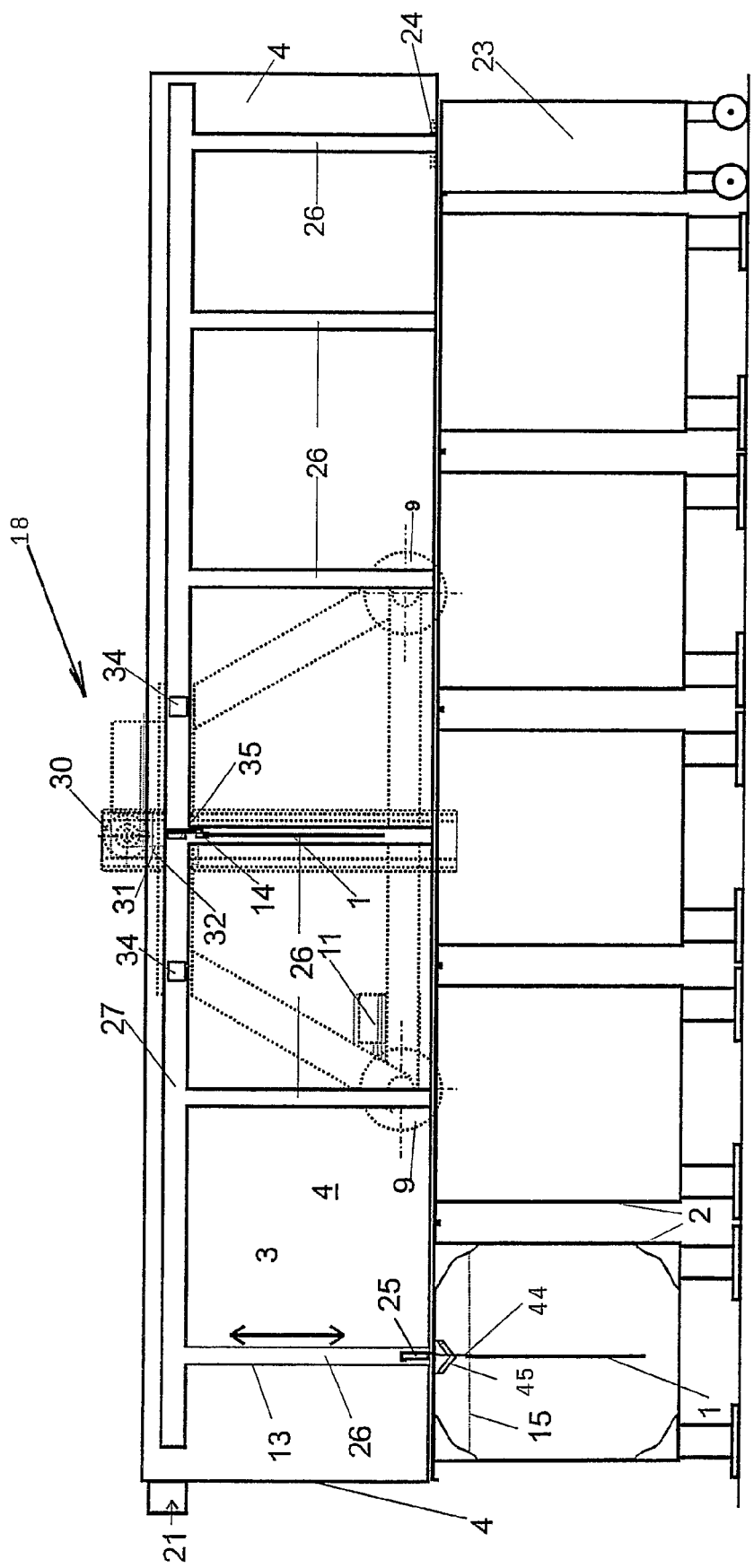
FIG. 5 is a sectional side view of another embodiment of the device of the invention similar to the embodiment in FIG. 4 with the conveyor system being shown by the dashed line.

FIG. 5 shows a sectional side view of another embodiment of the device of the invention similar to the embodiment in FIG. 4 with the conveyor system being shown in a dashed line (showing the half located behind the plane of the drawing). The right portion of FIG. 5 illustrates the loading and discharging station 23 and entrance opening/lock 24 The vertical slots 26 directly extend to the entrance opening 24 formed in the clean room housing.

Above the left processing tank 2 that has been partially sectioned, there can be seen a flight bar 25 that extends into the plane of the drawing. The work pieces 1 are hung on the flight bar. At the front and rear end thereof, the flight bar projects through the vertical slot 26 formed in the side wall 4 out of the clean room zone 3. A receiving device 45 for retaining the flight bar is shown beneath the flight bar. When the carrier arms of the transport carriage that has not been illustrated herein for the sake of clarity are raised, the flight bar with the work pieces 1 retained by holding means 44 travels upward in the vertical slot into the upper position. In this position, the ends of the flight bar are simultaneously located in the vertical and in the horizontal slot 27 which merge into each other there. As described with reference to FIG. 4, the work pieces may now be conveyed to the next processing tank with the ends of the flight bar being horizontally guided in the horizontal slots.

The central portion of FIG. 5 shows an alternative embodiment having a traverse member 35 which may be raised and lowered and which is associated with the transport carriage 18. In lieu of a flight bar 25, it shows the traverse member for conveying the work pieces 1 in an upper travel position, said traverse member being guided on either side of the transport carriage and having the gripper elements 14 for the work pieces attached thereon. As contrasted with the flight bar, the traverse member cannot be put down at the processing tank 2 because it is solidly connected to the transport carriage. The work pieces are located above the processing tank on the traverse member that projects through the side wall 4 to the outside. In this lifted position, the traverse member can freely move in the horizontal slot 27 to the right and to the left in the direction of travel of the transport carriage. Further, there are shown two cross bracings 34 by means of which two such transport carriages disposed on the two long sides of the row of tanks are additionally mutually stabilized. The cross bracings are guided on the right and on the left side of the horizontal slot when viewed in the direction of the protruding traverse member. In this slot they are also free to move to the left and to the right. To dimension the length of the horizontal slot, the additional range of movement the cross bracings of the transport carriage need in the horizontal slot at the outer processing tanks must be taken into consideration. As the traverse member is fastened on either side of the hoisting gear (not illustrated herein) and extends through the clean room zone 3 and through the side walls 4, the transport carriage is only allowed to travel when the traverse member is in the upper position inside the horizontal slot. This particularly applies when the transport carriage runs empty and conveys no work pieces.

FIGS. 6 and 7 show a preferred embodiment of a device for chemically or electrolytically treating under clean room conditions work pieces in accordance with the invention, with FIG. 6 showing a side view of the embodiment similar to FIGS. 4 and 5. As contrasted to FIG. 5, the clean room zone 3 in this Fig. only extends over one processing tank 2 or over three processing tanks arranged side by side, and does not extend over one or a plurality of rows of tanks. In this case, the clean room zone is associated with the transport carriages 18 and travels together with these from one processing tank 2 to the other. Additionally, the transport carriages are mutually stabilized by cross bracings 34. FIG. 7 shows the front view of the device as shown in FIG. 6.

In this exemplary embodiment, the processing tanks 2 are provided with covers 41 (e.g., sliding covers). The openings, e.g., the inlet slots, (not shown) for the work pieces may for example be closed by sliding the covers.

In addition to the clean room zone 3, the processing tanks 2 may be pressurized with filtered gas compressed at a slight overpressure and supplied through pipes and connecting tubings that have not been illustrated herein. As a result, the narrow inlet slots formed above the processing tanks for the work pieces 1 could, at need, also remain open during the treatment. The clean room zone is formed by side walls 4 having vertical slots 26 and by top walls 5 and bottom walls 42. The bottom wall comprises one or a plurality of lead-through openings, e.g., entrance openings, (not shown) located opposite the cover 41 of the processing tanks. The work pieces are conveyed as described in FIGS. 4 and 5.

The left portion of FIG. 6 shows a sectioned processing tank 2 that is filled with a treatment liquid up to the liquid level 15 and that contains a work piece 1 retained by a flight bar 25 provided with holding means 44. The flight bar rests on receiving devices 45 provided on the processing tank and is picked up and transported by the transport carriages by means of carrier arms (not shown). In order to maintain the clean room conditions in the processing tank, the opening for the work pieces in the cover 41 of the processing tank is preferably closed during treatment and in pauses in the operation in order to prevent contamination of the treatment liquid and of the work pieces. Additionally, suction channels (46) for drawing vapours exiting the processing tank at its top may be provided.

The clean room conditions in the clean room zone 3 are provided by a fresh air supply source that is disposed above the transport carriage. For this purpose, the supply source comprises at the top wall 5 an assembly with suction openings 39 through which air that has been cleaned by air filters is forced through inflow openings 40 into the clean room zone by means of a fan 37 and an air filter housing 36. A fresh air duct having outflow openings 38 may additionally be provided above the path for the transport carriages 18 at the stopping places thereof. The openings 38 may be provided with valve flaps that open when the transport carriages stop at the stopping place thereof (FIG. 7). The distance between the fresh air duct with outflow openings 38 and the suction openings 39 of a fan should be chosen to be as small as possible in order to prevent contaminated secondary air from being drawn in.

A laminar air flow from the top to the bottom is generated inside the clean room zone as a result of the large number of openings 40 that are disposed so as to coincide in the filter housing 36 and in the top wall 5 of the housing of the clean room zone 3. The clean air may thereby exit the space between the tank covers 41 and the bottom wall 42 of the housing as well as the vertical slots 26 formed in the side walls 4. If the processing tank 2 is equipped with suction means 46, major part of the clean air blown there into is evacuated through the suction channels. The overpressure in the clean room zone with respect to the clean room zone environment prevents unfiltered air from penetrating the clean room zone. In this case again, all the drives and hoisting gears for conveying the work pieces 1 are disposed outside of the clean room zone. In order to further improve the quality of the air in the closed processing tanks 2, filtered clean air may be blown into the top portion of the processing tank (above the bath level) as described herein above, with a slight overpressure being established with respect to the ambient atmosphere (in FIGS. 6 and 7; not shown). The suction channels for exiting gases that may be additionally provided at need can be mounted beside the covers 41 of the processing tanks in order to collect the gases exiting the processing tanks as a result of overpressure. This permits to prevent potentially noxious vapours from emanating from the processing tanks into the room.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LISTING OF NUMERALS

1 work piece(s)
2 processing tank
3 clean room zone
4 wall, side wall
5 top wall
6 intermediate support for the top wall 5 of the clean room housing
7 lead-through openings in the top wall 5 of the clean room housing
8 transport carriage rail
9 transport carriage chassis
10 rail carrier
11 travel motor
12 lifting cylinder
13 lifting rod
14 gripper element for the work pieces 1
15 bath level
16 hoisting gear
17 lifting beam
18 transport carriage
19 cog belt
20 transport carriage supporting frame
21 connecting tubing for clean air or gas supply
22 window for maintenance purposes
23 loading and discharging station (protective transport container)
24 entrance opening/lock
25 flight bar
26 vertical lead-through openings/vertical slots
27 horizontal lead-through openings/horizontal slots
29 lifting motor
30 lifting belt drum
31 lifting belt
32 guide piece
33 carrier arm for the flight bar 25
34 cross bracing
35 traverse member
36 air filter housing with air filters
37 fan
38 fresh air duct with outflow openings
39 suction opening
40 inflow openings
41 cover
42 bottom wall
43 axis
44 holding means
45 receiving device

The invention claimed is:

1. A device for chemically or electrolytically treating work pieces (1), said device comprising:
   at least one processing tank (2) for treating the work pieces;
   means for applying suction communicating with said at least one processing tank; and
   at least one conveyor system for transporting the work pieces, said at least one conveyor system comprising:
      at least one transport carriage (18), wherein said at least one transport carriage (18) is provided with at least one clean room zone (3) such that said at least one clean room zone travels together with said at least one transport carriage (18), said clean room zone having a top and a bottom, wherein the clean room zone (3) is movable to or from said at least one processing tank (2) with said at least one transport carriage (18);
      at least one holding element for holding the work pieces (1), said at least one holding element being either disposed inside the clean room zone (3) or disposed inside the clean room zone with a portion thereof projecting out of the clean room zone;
      an apparatus for raising and lowering the work pieces (1) provided between said at least one transport carriage (18) and said at least one holding element; and
      means (36, 37) for cleaning of air disposed on said at least one transport carriage (18),
      wherein a clearance is provided between said bottom of said clean room zone and said at least one processing tank when said clean room zone is positioned at said at least one processing tank during transfer of the work pieces (1) between said clean room zone and said at least one processing tank, wherein said at least one conveyor system is adapted to maintain the work pieces in a vertical alignment, wherein said means for cleaning generates laminar flow of clean air from said top of said clean room zone to said bottom of said clean room zone, the clean air at least in part exiting through said clearance between said bottom of said clean room zone and said at least one processing tank in order to provide clean room conditions in said clean room zone, and
      wherein the clean air at least in part exits through said means for applying suction when the work pieces (1) are being transferred between said clean room zone and said at least one processing tank.

2. The device according to claim 1, wherein said at least one transport carriage (18) is one of a plurality of transport carriages (18) and wherein the transport carriages (18) are disposed outside of the clean room zone (3).

3. The device according to claim 2, characterized in that the transport carriages (18) each comprise a motion drive (11) and a transport carriage chassis (9).

4. The device according to any one of claims 2-3, wherein said holding element is a flight bar (25) and said apparatus for raising and lowering the work pieces (1) comprises a vertically movable receiving device (33) provided on each of said transport carriages (18), said receiving device (33) engaging said flight bar (25) when raising or lowering said flight bar (25).

5. The device according to claim 1, wherein said at least one holding element is one of a plurality of holding elements and at least one of said plurality of holding elements comprises a member of a group consisting of gripper elements (14) and flight bars (25).

6. The device according to any one of the preceding claims 2-3, wherein said apparatus for raising and lowering the work pieces (1) comprises at least one connection means.

7. The device according to claim 6, characterized in that said at least one connection means comprises at least one part that is selected from a group consisting of traverse members (35) and lifting mechanisms (12, 13).

8. The device according to claim 7, characterized in that the traverse members (35) are fastened to the transport carriages (18).

9. The device according to claim 7, characterized in that the traverse members (35) are connected to respective hoisting gears (16).

10. The device according to claim 7, characterized in that the lifting mechanisms (12, 13) are fastened to the traverse members (35).

11. The device according to claim 7, characterized in that the lifting mechanisms are lifting piston/cylinder systems (12, 13).

12. The device according to any one of the preceding claims 1-3, characterized in that the clean room zone (3) is spatially defined by at least one clean room housing each comprising at least one lead-through opening (7, 24, 26, 27), said at least one clean room housing being pressurizable by being supplied with cleaned air.

13. The device according to claim 12, characterized in that the traverse members (35) are located inside the clean room zone (3) with portions of said traverse members projecting out of the clean room zone and are passed through the at least one lead-through opening (26, 27) in the at least one housing.

14. The device according to claim 12, characterized in that the lifting mechanisms are located partially inside and partially outside of the clean room zone (3) and are passed through the at least one lead-through opening (7) in the at least one clean room housing.

15. The device according to 12, characterized in that the flight bars (25) are passed through the at least one lead-through opening (26, 27) in the at least one housing.

16. The device according to any one of claims 1-3, characterized in that there is provided at least one loading and discharging station (23) from which the work pieces (1) may be transferred into the clean room zone (3) through a respective entrance opening (24) formed in the at least one clean room housing.

17. The device according to any one of the preceding claims 1-3, characterized in that covers (41) with inlet openings for the work pieces (1) are provided on the at least one processing tank (2).

18. The device according to claim 17, characterized in that the covers (41) are closable in order to shield the interior of the tanks (2) from the ambient air and that there is provided a device for supplying a cleaned gas to the at least one processing tank (2) at an overpressure.

* * * * *